(12) United States Patent
Demel et al.

(10) Patent No.: US 6,966,560 B2
(45) Date of Patent: Nov. 22, 2005

(54) DEVICE FOR FIXING THIN AND FLEXIBLE SUBSTRATES

(75) Inventors: Walter Demel, Karlsfeld (DE); Ralph Zoberbier, Langenbach (DE)

(73) Assignee: Suss MicroTec Lithography GmbH, Garching (DE)

(*) Notice: Subject to any disclaimer, the term of this patent is extended or adjusted under 35 U.S.C. 154(b) by 166 days.

(21) Appl. No.: 10/631,330

(22) Filed: Jul. 31, 2003

(65) Prior Publication Data

US 2004/0104326 A1 Jun. 3, 2004

(30) Foreign Application Priority Data

Aug. 2, 2002 (DE) ................. 102 35 482

(51) Int. Cl.[7] ............................................. B23B 31/30
(52) U.S. Cl. ........................................ 279/3; 118/500
(58) Field of Search ............................. 279/3; 269/21; 118/500, 730; 451/289, 388

(56) References Cited

U.S. PATENT DOCUMENTS

| | | | |
|---|---|---|---|
| 3,627,338 A | * | 12/1971 | Thompson ...................... 279/3 |
| 4,131,267 A | * | 12/1978 | Ono et al. ..................... 269/21 |
| 5,191,218 A | * | 3/1993 | Mori et al. ............ 250/453.11 |
| 5,324,012 A | * | 6/1994 | Aoyama et al. .............. 269/21 |
| 5,989,760 A | * | 11/1999 | Mangat et al. ................. 430/22 |
| 6,072,157 A | * | 6/2000 | Klebanoff et al. ........... 219/228 |
| 6,271,676 B1 | * | 8/2001 | Montoya ...................... 324/765 |
| 6,375,176 B1 | * | 4/2002 | Getchel et al. ............... 269/21 |
| 6,386,957 B1 | * | 5/2002 | Masumura et al. ........... 451/59 |
| 6,402,594 B1 | * | 6/2002 | Kobayashi et al. ........... 451/41 |
| 6,540,014 B2 | * | 4/2003 | Getchel et al. ............ 165/80.1 |
| 6,632,325 B2 | * | 10/2003 | Lingampalli ............ 156/345.51 |

FOREIGN PATENT DOCUMENTS

| | | | | |
|---|---|---|---|---|
| DE | 69322835 T2 | | 6/1999 | |
| EP | 0595071 A1 | | 5/1994 | |
| GB | 2149697 A | * | 6/1985 | .......... B25B 11/00 |
| JP | 64001294 A | * | 1/1989 | ............ H05K 3/00 |
| JP | 03286549 A | * | 12/1991 | ........... H01L 21/68 |
| JP | 05047909 A | * | 2/1993 | ........... H01L 21/68 |
| JP | 05082631 A | * | 4/1993 | ........... H01L 21/68 |

* cited by examiner

Primary Examiner—Boyer D. Ashley
Assistant Examiner—Michael W. Talbot
(74) Attorney, Agent, or Firm—Perman & Green, LLP.

(57) ABSTRACT

A device or chuck for fixing thin and/or flexible substrates allows a uniform and all-over sucking-up of the substrates without any disadvantageous warping or bending. The chuck has notches and holes communicating with a plurality of microgrooves arranged on the bearing surface. If a vacuum device sucks off air through the bores and the notches, a vacuum extends in the microgrooves so that a substrate located on the bearing surface is sucked up.

17 Claims, 2 Drawing Sheets

DEVICE FOR FIXING THIN AND FLEXIBLE SUBSTRATES

BACKGROUND OF THE INVENTION

1. Field of the Invention

The present invention relates to a device or chuck or a clamping device for fixing thin and/or flexible substrates.

2. Brief Description of Related Developments

One of the main objects of a mask aligner is the positioning and above all fixing of the mask and the substrate for being able to carry out a successful exposure process. The substrate is fixed on a specific device, a so-called chuck, which, via specifically arranged vacuum channels, sucks up and holds the substrate, e.g. a wafer, and thus allows the subsequent alignment, i.e., the adjustment of the mask and the substrate with respect to each other.

SUMMARY OF THE INVENTION

An example for the surface of such a known chuck 100 is shown in FIG. 1. The vacuum channels 101 are formed as concentrical circles, and a plurality of radial channels 102 connect the circularly arranged channels 101 with each other. Moreover, the chuck has holes 103 or notches which are connected with a vacuum device (not shown) and through which the air can be sucked off so that a vacuum can be generated in the channels covered by the wafer.

In addition to the common silicon wafers, in industry recently more and more other, thin and flexible substrates are used, e.g. in the field of tape automatic bonding (TAB) or for the application in flexible flat panel displays. In order to be able to suck up these substrates in an optimum manner, new technologies are required.

The problems concerned with sucking up flexible substrates generally reside in that these substrates tend to warp and twist and have a certain basic waviness. In the field of TAB, an additional edge waviness of the substrate occurs due to the use of protective foils or sheets being inserted between the rolled-up layers of the Cu tapes to be processed.

If such substrates are fixed with the aid of conventional chucks by sucking up, there is the risk that the surfaces of the substrates lying above a vacuum channel or a notch are sucked into the notch due to their low stiffness and thickness so that an additional waviness of the substrate surface is caused. On the one hand, this leads to an irregular alignment distance and above all exposure distance, on the other hand there is the risk that—at the alignment and/or exposure distance—the substrates contact, spoil or even destroy the mask. For these reasons, it is not advisable to suck up flexible substrates punctually over wide notches or holes with a great suction force.

A device according to the preamble of claim 1 is known from EP 0 595 071 A1 and the corresponding DE 693 22 835 T2.

It is the object of the invention to provide a device or chuck for fixing thin and/or flexible substrates, thereby allowing a uniform and all-over sucking up of the substrates without any disadvantageous warping or bending.

This object is achieved with the features of the claims.

In achieving this object, the invention is based on the general idea to provide a plurality of microgrooves, which are produced by means of a suitable tool, on the bearing surface of the chuck. Moreover, the device of the invention comprises notches and/or holes which communicate with the microgrooves and via which air is sucked off by means of a vacuum device in order to generate a vacuum in the microgrooves when the substrate is put on the chuck.

In addition, the channels can take up dirt particles which are probably present on the lower surface of the substrate, so that these dirt particles do not deteriorate the flatness of the put-on substrate.

BRIEF DESCRIPTION OF THE DRAWINGS

In the following, the invention will be described in more detail on the basis of working examples and with reference to the drawing in which FIG. 1 schematically shows the surface of a conventional chuck;

FIGS. 3(*a*) and (*b*) are schematic top views of the bearing surface of the device in the direction of the arrow A in FIG. 2 in two alternative embodiments; and.

DETAILED DESCRIPTION OF THE PREFERRED EMBODIMENT(S)

Figure 1:
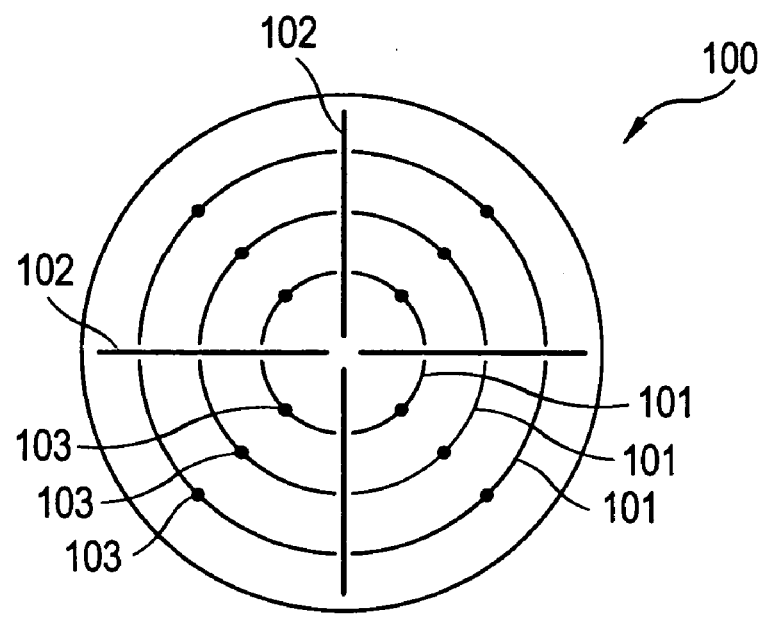
Figure 2:
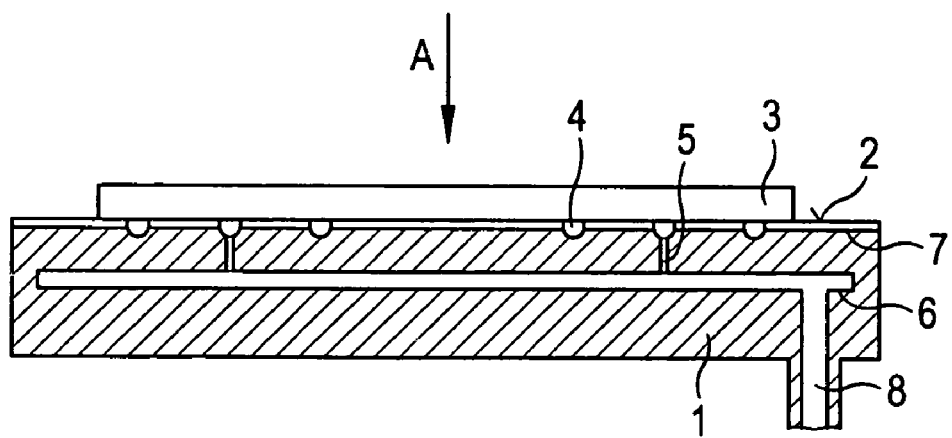
FIG. 2 is a schematic side view of a device according to the invention.

FIG. 2 is a schematic side view of the device according to the invention for fixing a substrate 3. The substrate 3 is arranged on the flat bearing surface 2 of the holding device 1. In its bearing surface 2, the holding device 1 has notches 4 which are connected with each other and, via holes 5, with a vacuum device 6, e.g., in the form of a vacuum channel.

For example, a suction opening 8 is connected with a vacuum pump (not shown) so that air can be sucked off via the vacuum channel 6 and through the holes 5 and the notches 4. Depending on the size of the substrate 3 to be sucked up, preferably only a part of the notches 4 and/or holes 5 can be connected with the suction opening 8.

Moreover, a plurality of microgrooves 7 are engraved into the bearing surface 2 of the holding device 1. These microgrooves 7 communicate with the notches 4 and/or holes 5 serving as the vacuum supply. By sucking off air via the vacuum device 6, a vacuum is generated in the microgrooves 7 when the substrate 3 is put on, said vacuum sucking up the substrate 3 onto the bearing surface 2.

Figure 3A:
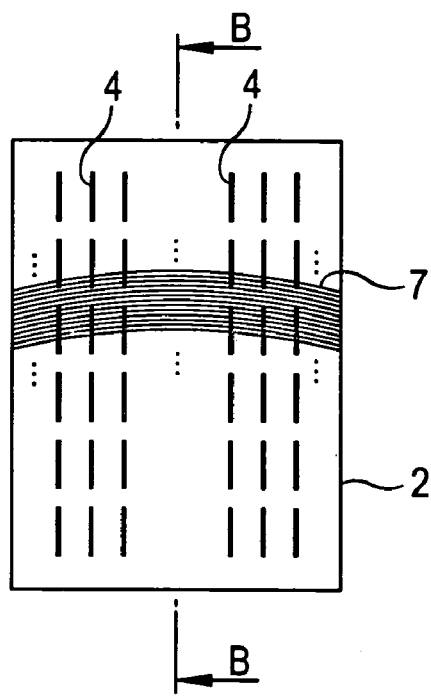

FIG. 3(*a*) is a schematic top view of the bearing surface 2 without the substrate to be fixed. In the shown embodiment, the microgrooves 7 are arranged in the form of segments of a circle. The radius of the segments of the circle is, e.g., 40 to 100 mm, preferably 60 to 80 mm, particularly preferably 70 mm. The notches 4 are shaped as slots extending transversely with respect to the microgrooves 7 and have a length of, e.g., 1.5 cm and a width of, e.g., 0.5 mm. Due to this arrangement, essentially all microgrooves 7 communicate with at least one notch 4 through which air is sucked in.

In FIG. 3(*a*), like in FIG. 3(*b*), which will be discussed in the following, only a part of the actually present microgrooves 7 is drawn in, in order to improve clarity. These microgrooves 7 are preferably distributed regularly or uniformly on the entire bearing surface 2 (or on a large part thereof).

Figure 3B:
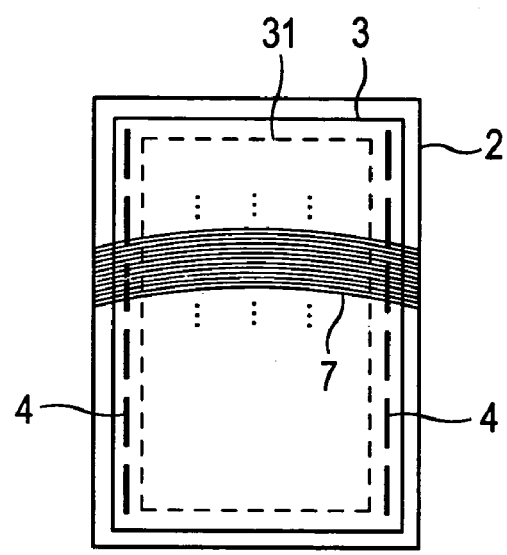
Figure 4:
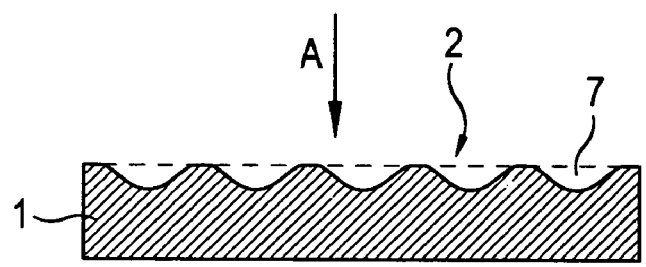
FIG. 4 is a schematic cross-section B—B of the bearing surface of FIG. 3(*a*).

FIG. 4 is a schematic cross-sectional view of the bearing surface 2 of the device of the invention along the line B—B in FIG. 3(*a*). The microgrooves 7 have a depth of 30 to 70 $\mu$m, preferably of 40 to 60 $\mu$m, particularly preferably of 50 $\mu$m and a width of 80 to 160 $\mu$m, preferably of 100 to 140

μm, particularly preferably of 120 μm. The distance between the individual grooves is, e.g., 0.1 to 0.2 mm, preferably 0.15 mm.

If the substrate 3 is put on and if air is sucked in through the notches 4 and/or holes 5, a vacuum is generated in the microgrooves 7 extending from the supply notches 4. The plurality of microgrooves 7 and their small channel widths make it possible that the substrate 3 lying thereon is sucked up more or less all-over its surface. In a preferred embodiment, the relationship between bearing surface and sucking-up surface is about 1:3 and establishes the fact that the substrate 3 is sucked up very well. Due to the small widths of the indentations, i.e. the notches 4 and the microgrooves 7, the substrate 3 deforms only very little during the sucking up process.

A further advantage of the small cross-section of the microgrooves 7 is the fact that at the edge of the substrate 3 and at probably present recesses in the substrate 3 only very little air is sucked up so that the vacuum leakage is negligible. Thus, the substrate is optimally sucked up even in the area of holes, which are probably present at the edge, due to the large number and the small cross-section of the microgrooves 7.

FIG. 3(b) is a top view of an alternative embodiment of the bearing surface 2. This embodiment differs from the embodiment shown in FIG. 3(a) only in the arrangement of the notches 4. The substrate 3 to be fixed is exemplarily shown as a rectangle but can have any desired shape. The substrate 3 has a use surface 31. The use surface 31 is the area of the substrate 3 which is exposed during the later exposure process. The supply notches 4 are arranged such that they are covered by the substrate, so that the vacuum necessary for the fixing can be generated in the microgrooves 7, but do not lie within the area of the use surface 31. It can thus be ensured that even if the substrate 3 is sucked into the notches 4, which have a greater width than the microgrooves 7, the thus generated waviness of the substrate surface occurs only outside the use surface 31 so that a regular alignment and exposure distance is assured in the area of the use surface 31. The arrangement of the notches 4 can be optimized depending on the shape and size of the substrate 3 in such a way that an as large as possible use surface 31 is present.

In the shown embodiments the microgrooves 7 have a circular shape; within the scope of the invention, they can also have a straight, elliptic, parabolic or any desired shape, wherein it must only be assured that with a given substrate and given dimensions of the microgrooves (e.g. width, depth and distance from the neighboring microgroove), the substrate is sucked up sufficiently without any disadvantageous warping.

For producing the microgrooves 7 on the bearing surface 2 of a chuck according to the present invention, for example a turning tool or chisel is used which, e.g., has a cutting edge being made of hard metal and having a radius of 0.2 mm. The further characteristic data according to DIN 6581 of a turning tool are, for example: relief angle $\alpha=6°$, wedge angle $\beta=80°$, rake angle $y=4°$, edge angle $\epsilon_r=45°$, adjustment angle $K_r= 90°$ and inclination angle $\lambda_r=1°$.

The turning tool is clamped in a vertical head of a milling maching, so that the turning tool performs a rotary movement during machining. The radius of the movement and thus of the milled structures is preferably about 70 mm. The chuck is clamped in such a manner that the microengravings 7 are milled vertically with respect to the transport direction of the substrate. The spindle speed is about 500 revolutions/minute and the feed is about 40 mm/minute. After the milling operation, the surface of the chuck is preferably treated by grinding or lapping in order to obtain again a flat bearing surface. Finally, the surface of the chuck can be eloxed black or provided with a hard coating.

What is claimed is:

1. A device for fixing a thin and/or flexible substrate, comprising a holding device for placing and holding a substrate on its bearing surface in which notches and/or holes, which communicate with each other and with a vacuum device, are formed, wherein a plurality of microgrooves, which communicate with the notches and/or holes, are provided in the bearing surface, the notches being formed as slots extending transversely with respect to a direction of the microgrooves.

2. The device according to claim 1, wherein the microgrooves have a width of 80 to 160 μm.

3. The device according to claim 1, wherein the microgrooves have a depth of 30 to 70 μm.

4. The device according to claim 1, wherein the microgrooves are formed on the device as segments of a circle, wherein a radius is 40 to 100 mm.

5. The device according to claim 1, wherein a distance between the microgrooves is 0.1 to 0.2 mm.

6. The device according to claim 1, wherein the notches have a length of 1 to 3 cm and a width of 0.2 to 0.5 mm.

7. The device according to claim 1, wherein, depending on a size of the substrate to be sucked up, optionally only a part of the notches and/or holes is connectible with the vacuum device.

8. The device according to claim 1, wherein the bearing surface is hardened.

9. The device according to claim 1, wherein the bearing surface is eloxed black or provided with a hard coating.

10. The device according to claim 1, wherein the holding device or its surface is made of aluminum.

11. The device according to claim 1, wherein the microgrooves have a width of 100 to 140 μm.

12. The device according to claim 1, wherein the microgrooves have a width of 120 μm.

13. The device according to claim 1, wherein the microgrooves have a depth of 40 to 60 μm.

14. The device according to claim 1, wherein the microgrooves have a depth of 50 μm.

15. The device according to claim 1, wherein a distance between the microgrooves is 0.15 mm.

16. The device according to claim 4, wherein the radius is 60 to 80 mm.

17. The device according to claim 4, wherein the radius is 70 mm.

* * * * *